(12) United States Patent
Johnson

(10) Patent No.: US 7,832,699 B2
(45) Date of Patent: Nov. 16, 2010

(54) INSTRUMENT MOUNTING DEVICE AND METHOD

(76) Inventor: Archie L. Johnson, 511 Pargrave Pl., Bloomington, IN (US) 47403

( * ) Notice: Subject to any disclaimer, the term of this patent is extended or adjusted under 35 U.S.C. 154(b) by 569 days.

(21) Appl. No.: 11/897,040

(22) Filed: Aug. 29, 2007

(65) Prior Publication Data

US 2009/0057496 A1  Mar. 5, 2009

(51) Int. Cl.
*A47G 1/10* (2006.01)
*G12B 9/00* (2006.01)
*F16L 5/00* (2006.01)

(52) U.S. Cl. .................. 248/316.1; 248/27.1; 248/27.2; 248/56; 248/57

(58) Field of Classification Search .............. 248/316.1, 248/27.1, 27.2, 56, 57
See application file for complete search history.

(56) References Cited

U.S. PATENT DOCUMENTS

| | | | |
|---|---|---|---|
| 2,139,059 A | 12/1938 | Lybrand | |
| 2,616,644 A | 11/1952 | Christophersen | |
| 2,665,094 A | 1/1954 | Christrophersen | |
| 2,778,085 A | 1/1957 | Bernard | |
| 2,803,866 A | 8/1957 | Flora | |
| 2,855,167 A | 10/1958 | Christophersen | |
| 2,903,228 A | 9/1959 | Neher et al. | |
| 2,932,546 A | 4/1960 | Marggraf et al. | |
| 2,969,214 A | 1/1961 | Torresen | |
| 3,097,820 A | 7/1963 | Castle | |
| 3,589,656 A | 6/1971 | Protzmann | |
| 3,765,628 A | 10/1973 | Wilson | |
| 4,410,155 A | 10/1983 | Wetterhorn et al. | |
| 4,563,795 A | 1/1986 | Fournier | |
| 4,609,171 A * | 9/1986 | Matsui | 248/74.3 |
| 4,659,099 A * | 4/1987 | Malone | 280/304.1 |
| 6,612,076 B2 * | 9/2003 | Jacksen | 52/27 |
| 6,938,859 B2 * | 9/2005 | Beausoleil | 248/27.1 |
| 7,195,212 B2 | 3/2007 | Bond | |
| 2005/0217198 A1 * | 10/2005 | Carraher et al. | 52/719 |

OTHER PUBLICATIONS

WIPO,PCT Search Report and Written Opinion, Dec. 3, 2008, 6 pages, WIPO, United States.

* cited by examiner

*Primary Examiner*—Terrell Mckinnon
*Assistant Examiner*—Christopher Garft
(74) *Attorney, Agent, or Firm*—Liell & McNeil

(57) ABSTRACT

An instrument mounting device includes a first component having a flexible band configured to clamp about an instrument for mounting within an instrument panel. A second component is configured to couple with the first component and includes diagonal ramp surfaces configured to slidingly engage with diagonal ramp surfaces on the first component to adjust the band to a clamping configuration. A method of making instrument mounting devices includes forming first and second elongate bodies such as extrusions, each of which may be divided into a plurality of separate units for assembling into a plurality of instrument mounting devices.

12 Claims, 2 Drawing Sheets

INSTRUMENT MOUNTING DEVICE AND METHOD

TECHNICAL FIELD

The present disclosure relates generally to mounts of the type used in connection with avionics sensing instruments, and relates more particularly to a mounting device having a unique closing feature for mounting a sensing instrument in an instrument panel.

BACKGROUND

A variety of machines utilize specialized instruments for monitoring and recording various operating parameters. In the avionics context, it is common for an aircraft instrument panel to have a number of instruments positioned therein and viewable by a pilot. A typical design includes a mounting device which is configured to mount to a back side of an instrument panel such that the instrument extends through the instrument panel and is supported by the device. A great many different closing/clamping mechanisms for instrument mounting devices have been proposed over the years, some meeting with significant commercial success. A variety of challenges, some specific to the avionics context, continue to drive the search for improved designs.

On the one hand, properly grounding an instrument mount to the instrument panel can be difficult with certain designs. In modern high powered avionics applications, a low electrical resistance between an instrument and an instrument panel, and the chassis of the instrument is typically required. To a certain extent, instrument mount design has been driven by this concern. The problem has typically been overcome by brazing a mounting part of the device to a body thereof. This technique, while often effective, is relatively labor intensive.

Another challenge to engineers designing instrument mounts and the like relates to the actual design of the mechanism by which such devices are clamped or closed about an instrument. The closing mechanism is typically actuated via rivets, screws, etc. which attach the closing mechanism to the body of the instrument mount. These devices also tend to be relatively labor-intensive to assemble. Moreover, with such designs, tighter clamping force on the instrument can render the mount susceptible to failure due to the relatively high forces applied to the rivets, screws, etc.

It will thus be readily apparent that avionics instrument mounts which are stronger, simpler and more reliable than conventional devices would be welcomed by the industry.

SUMMARY OF THE INVENTION

In one aspect, the present disclosure provides a mounting device for mounting a sensing instrument in an instrument panel that includes a first component with a flexible band having an outer diameter, an inner diameter that includes a clamping surface for clamping about a sensing instrument and a mounting lug positioned on the outer diameter for coupling the device with an instrument panel. The band further includes a top edge, a bottom edge, a first end and a second end, and further includes first ramp surfaces located adjacent each of the first and second ends, respectively, and extending diagonally between the top and bottom edges of the band. The device further includes a second component configured to couple with the first component, the second component having a top edge, a bottom edge and second ramp surfaces extending diagonally between the top and bottom edges of the second component. The second component is movable relative to the first component when coupled therewith to adjust the band from a first configuration to a second, clamping configuration via sliding engagement between the first ramp surfaces and the second ramp surfaces.

In another aspect, the present disclosure provides a method of mounting a sensing instrument to an instrument panel, including a step of positioning a sensing instrument within an instrument panel. The method further includes a step of positioning a flexible band of a first component about a portion of the instrument. The flexible band has an inner diameter that includes a clamping surface for clamping about an instrument and first diagonal ramp surfaces extending between top and bottom edges of the band and positioned adjacent first and second ends thereof. The method further includes a step of coupling the first component to the instrument panel via a mounting lug positioned on an outer diameter of the flexible band, and clamping the flexible band about the instrument at least in part by slidingly engaging second diagonal ramp surfaces of a second component with the first ramp surfaces to adjust a configuration of the flexible band to a clamping configuration.

In still another aspect, the present disclosure provides a method of making mounting devices for sensing instruments. The method includes a step of forming a first component of an instrument mounting device from an elongate body having an inner diameter, an outer diameter, a thick walled lug portion and a thin walled clamping portion. The step of forming a first component includes machining a mounting lug from the thick walled lug portion, cutting lengthwise through the thin walled clamping portion, and machining first diagonal ramp surfaces on the outer diameter. The method further includes a step of forming a second component of an instrument mounting device from a second elongate body having a base portion and a second portion. The step of forming a second component includes machining second diagonal ramp surfaces on the second elongate body, the second ramp surfaces being configured to slidingly engage with the first ramp surfaces of the first component for clamping the thin walled clamping portion of the first component about an instrument.

DETAILED DESCRIPTION

Figure 1:
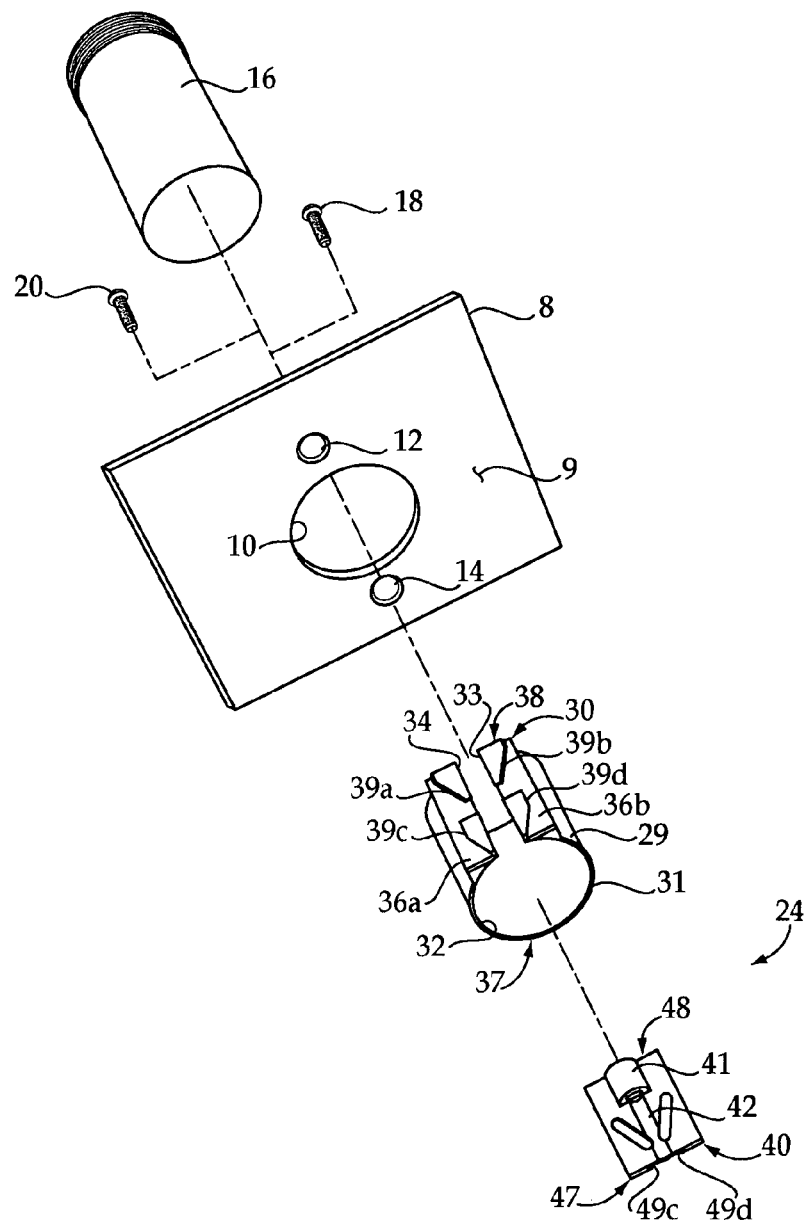
FIG. 1 is an exploded view of an instrument mounting device according to one embodiment, an instrument and an instrument panel.

Referring to FIG. 1, there is shown an instrument mounting or clamping device 24 which includes a first, clamp component 30 and a second, closing component 40. Component 30 is configured to clamp about an instrument, for example an avionics sensing instrument, for positioning the instrument in an instrument panel of a machine such as an aircraft. Second component 40 is configured to couple with first component 30, and is movable relative thereto to adjust component 30 from a first configuration to a second, clamping configuration, as further described herein. It is contemplated that the design, implementation and manufacturing of device 24 will provide a variety of advantages over the state of the art, including but not limited to improved strength and durability and relatively low electrical resistance, as well as low cost and ease of assembly.

Also shown in FIG. 1 is an instrument panel 8 having a back surface 9, which may be any suitable type of panel such as metallic panels commonly used in aircraft, a non-metallic panel such as those commonly used in the automotive industry, etc. An aperture 10 is formed in panel 8 and is configured to receive an instrument 16. Instrument 16 is shown schematically as a cylindrical instrument similar in configuration to various avionics sensing instruments such as altimeters, pressure gauges, fuel level indicators, engine speed indicators, roll indicators, etc. Devices contemplated herein may be those which conform to the requirements of National Aerospace standard NASM 28042 and Aeronautical Radio Inc. standard ARIRC Specification 408, but are by no means limited thereto. Thus, it should be appreciated that while one principal application of the present disclosure is considered to be in the mounting of avionics instruments, the embodiments contemplated herein could be implemented in a wide variety of environments. For example, various land vehicles and marine vehicles are known which include sensing instruments mounted in an instrument panel in such a way that the present disclosure may be advantageously applied thereto. Similarly, while mobile machines such as aircraft, land vehicles, marine vehicles, etc. may benefit from application of the teachings set forth herein, the present disclosure might also be applied in such environments as industrial process controls, portable sensing instrumentation, etc. As used herein, the term "sensing" should be understood to apply to any known technique for evaluating any parameter of interest, such as mechanical or electronic or radiometric sensing. Similarly, the term "instrument" should be understood to refer to any mechanical, electrical, radiometric, etc., article intended to and capable of carrying out sensing of any parameter of interest.

Device 24 may operate in a unique manner which provides a reliable, strong and relatively low electrical resistance mounting strategy for instrument 16. In one embodiment, first component 30 may have a generally annular configuration, and may be adjustable from a first, open configuration similar to that shown in FIG. 1 in which an instrument may be readily positioned therein, to a second, clamping configuration, in which an instrument is not readily removable. Inner diameter 32 may define a regular cylinder in its second configuration. Component 30 may include a moderately flexible band 31 having an inner diameter 32 which comprises a clamping surface configured to clamp about an instrument when component 30 is in its second, clamping configuration. As mentioned above, second component 40 may comprise a closing component configured to adjust first component 30 from its first configuration to its second configuration, as further described herein.

Figure 3:
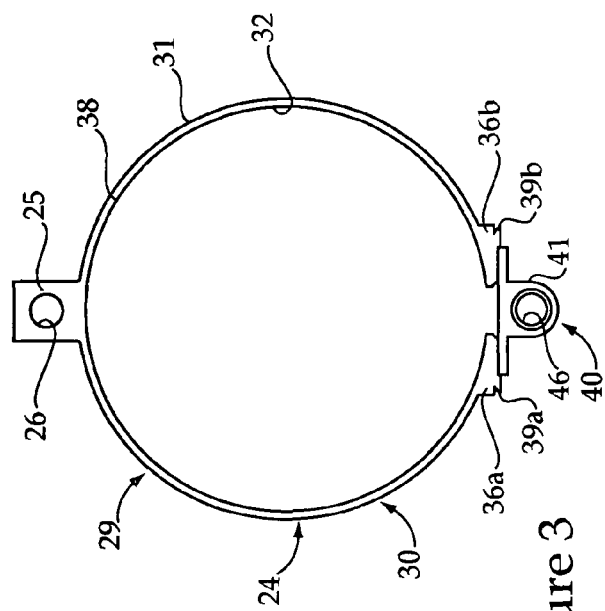
FIG. 3 is a top view of an instrument mounting device according to one embodiment.
Figure 4:
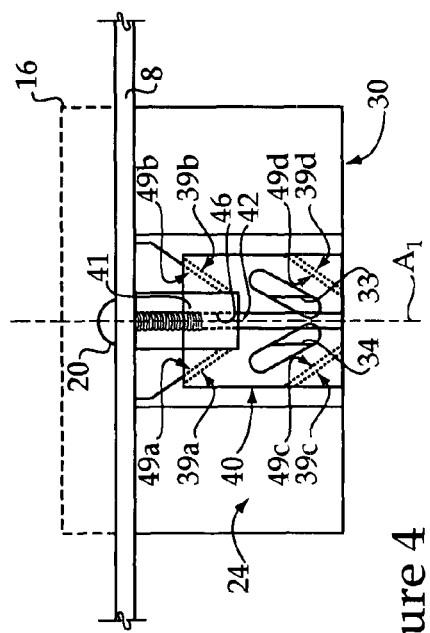
FIG. 4 is a front view of an instrument mounting device positioned within an instrument panel, according to one embodiment.

First component 30 may further include a top peripheral edge 38, and a bottom peripheral edge 37, as well as a first end 33 and a second end 34. Referring also to FIG. 3, first component 30 may have a mounting lug 25 positioned on an outer diameter 29 adjacent top edge 38 and having a bore, for example a threaded bore 26, extending therein. One of fasteners 18 and 20 shown in FIG. 1 may extend through a corresponding bore 12, 14 in instrument panel 8 for engaging in bore 26. Accordingly, device 24 may be attached to instrument panel 8 at least in part by engagement of a bore in fastener 26. The other of fasteners 18 and 20 may extend through a corresponding bore 12, 14 for engaging with an adjustment element 41 of second component 40, the significance of which will be apparent from the following description. To this end, adjustment element 41 may also include a bore 46, for example an internally threaded bore, as shown in FIG. 4. When a fastener is extended through instrument panel 8, it may be rotated to engage in bore 46 and advance second component 40 toward instrument panel 8.

As alluded to above, second component 40 may slidingly engage with first component 30 in a manner distinct and providing advantages over other known strategies. To enable sliding engagement between the respective components 30 and 40, each of the components may be equipped with ramp surfaces which slide against one another to effectively shorten a distance between first end 33 and second end 34 of first component 30 as component 40 is advanced via rotation of a fastener in bore 26. To this end, first component 30 may include first ramp surfaces 39*a-d*, comprising linear ramp surfaces, which extend diagonally in a direction from bottom peripheral edge 37 towards top peripheral edge 38. The respective sets of two ramp surfaces adjacent ends 33 and 34 may diverge from one another in a direction toward edge 38, but could be convergent in other embodiments. In one embodiment, ramp surfaces 39*a-d* may include one set of two parallel ramp surfaces, 39*a* and 39*c*, positioned adjacent end 34 of first component 30 and located on a thickened end portion 36*a*. Ramp surfaces 39*a* and 39*c* may extend away from end 34 in a direction from peripheral edge 37 toward peripheral edge 38, as shown in FIG. 1. Another set of the first ramp surfaces, 39*b* and 39*d*, may be disposed adjacent end 33 of first component 30 on another thickened end portion 36*b*, and extend away from end 33 in a direction from bottom peripheral edge 37 toward top peripheral edge 38. Ramp surfaces 39*b* and 39*d* will typically also be parallel. Although the first ramp surfaces of component 30 will typically include four ramp surfaces, in other embodiments only two ramp surfaces, or more than four ramp surfaces, might be used. Moreover, surfaces which are non-linear but still capable of interacting with component 40 as described herein might be used.

Figure 2:
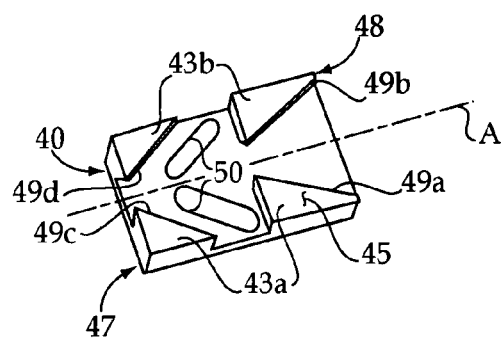
FIG. 2 is an isometric view of one component of an instrument mounting device according to one embodiment.

Turning to FIG. 2, there is shown second component 40 viewing a side opposite to that shown in FIG. 1. Second component 40 may include a bottom edge 47 and a top edge 48, and may include second ramp surfaces 49*a-d* which are configured to slidingly engage with the first ramp surfaces 39*a-d* of component 30. To this end, second ramp surfaces 49*a-d* may also comprise linear ramp surfaces extending diagonally in a direction from edge 47 towards edge 48, a first set 49*a* and 49*c* extending away from, but roughly facing, a second set 49*b* and 49*d*. Ramp surfaces 49*a-d* may face generally toward an axis A extending through midpoints of edges 47 and 48. Each of ramp surfaces 49*a-d* may be positioned upon thickened structures 43*a* and 43*b* of component 40 as shown, and may further consist of undercut ramp surfaces. By "undercut" it is meant that ramp surfaces 49*a-d* may be oriented at an angle less than 90° relative to top faces 45, of thickened structures 43*a* and 43*b*. First ramp surfaces 39*a-d* of component 30 may be similarly undercut to enable components 30 and 40 to interlock when engaged, but still allow sliding movement therebetween. Second component 40 may further include cutouts 50. Cutouts 50 may receive fasteners to prevent separation of components 30 and 40 during shipping and handling, which are later removed.

Referring in particular now to FIG. 4, there is shown a front view of device 24 where second component 40 is engaged with first component 30 and held in position at least in part via engagement of fastener 20 within bore 46. It may also be noted from FIG. 4 that an axis $A_1$ extends approximately through fastener 20 and a longitudinal center of bore 46. It may further be noted that the respective first ramp surfaces 39a-d are each positioned adjacent a corresponding one of second ramp surfaces 49a-d. Rotation of fastener 20 in a first direction will engage fastener 20 within threaded bore 46, drawing component 40 along axis $A_1$, and causing sliding engagement of first ramp surfaces 39a-d with second ramp surfaces 49a-d, in turn causing ends 33 and 34 of first component 30 to draw closer together. Rotation of fastener 20 in an opposite direction will tend to have an opposite effect, allowing ends 33 and 34 to move away from one another, such that clamping force about instrument 16 is gradually relieved and it may eventually be removed from device 24. Second component 40 may further include a channel 42 to accommodate fastener 20 if and when it extends all the way through bore 46 of adjustment element 41. While an internally threaded bore 46 is contemplated to be one practical implementation strategy, the present disclosure is not thereby limited and instead of an internally threaded bore, fastener 20 might engage with a nut positioned adjacent bore 46, or some other strategy altogether could be used.

Figure 7:
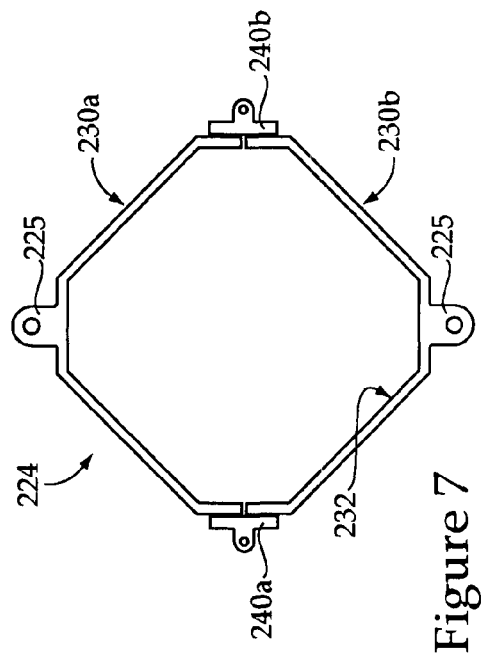
FIG. 7 is a top view of an instrument mounting device according to one embodiment.

Referring now to FIG. 7, there is shown an instrument mounting device 224 according to another embodiment. Device 224 operates according to principles similar to those described with regard to the foregoing embodiments, however, rather than a one piece first, clamping component, device 224 utilizes multiple clamping pieces including a first component 230a and a second component 230b. Each of components 230a and 230b includes a mounting lug 225 configured for use in a manner similar to that described with regard to device 24. Device 224 further includes two closing components 240a and 240b each of which are configured to couple components 230a and 230b together as shown to clamp about an instrument. Device 224 is further distinct from the foregoing embodiments in that rather than a substantially cylindrical inner diameter configured for clamping about cylindrical instruments, it includes a polygonal inner diameter 232. In the case of any of the embodiments described herein, it should be appreciated that the shape of the respective inner diameter/clamping surface is not limiting, and a variety of instruments might be mounted via mounting devices having appropriately shaped inner diameters, without departing from the full and fair scope of the present disclosure.

Figure 5:
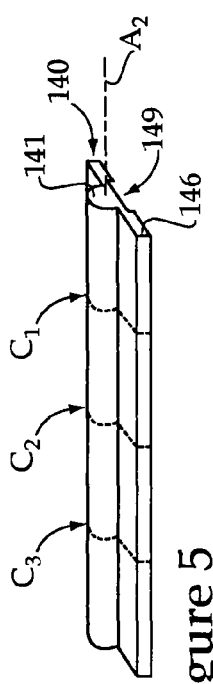
FIG. 5 is an extruded body for making one component of instrument mounting devices, according to one embodiment.
Figure 6:
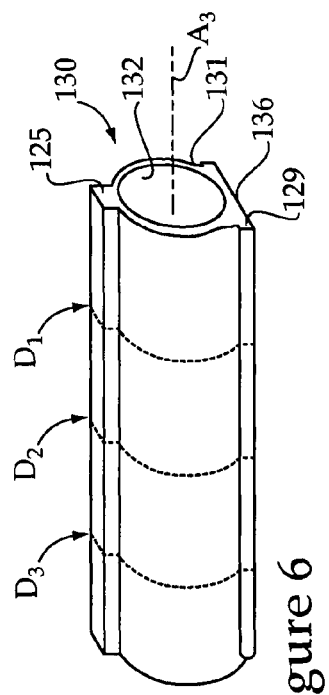
FIG. 6 is a different extruded body for making a different component of instrument mounting devices, according to one embodiment.

In addition to the unique structural and operational aspects of instrument mounting devices according to the present disclosure, a method of making instrument mounting devices is disclosed herein. In one embodiment, a plurality of parts similar to second component 40 may be created from a single elongate body, for example an extrusion. A plurality of clamping components similar to first component 30 may similarly be made from a single elongate body, which may also be an extrusion. Referring to FIGS. 5 and 6, a plurality of identical first components of an instrument mounting device may be made from a first elongate body 130, for example by cutting elongate body 130 at a plurality of locations $D_{1-3}$. Elongate body 130 may include an outer diameter 129, an inner diameter 132, a thin-walled clamping portion 131 and a thick walled lug portion 125. A center axis $A_3$ may extend through elongate body 130.

A second elongate body 140 also having a center axis $A_2$ may be used to create a plurality of closing components similar to component 40 described herein. In particular, a plurality of identical units may be formed from elongate body 140 by cutting elongate body 140 at a plurality of locations $C_{1-3}$. Elongate body 140 may include a base portion 146 having a channel 149 formed therein which is positioned adjacent a thickened second portion 141.

In one exemplary manufacturing/assembly process, each of elongate bodies 130 and 140 may comprise an extrusion, for example an aluminum extrusion, or some other extrudable metallic or non-metallic material or composite. Each of extrusions 140 and 130 may be cut at the corresponding cut lines, perpendicular axes $A_2$ and $A_3$, respectively, to generate a plurality of blanks for subsequent processing. Each of the blanks may then be machined to create certain of the features of the finished components. For instance, each of the blanks formed from elongate body 140 may have ramp surfaces machined thereon similar to ramp surfaces 49a-d described above. Adjustment elements may be machined from portion 141 of each of the blanks, similar to element 41 described above. Each of the blanks formed from elongate body 130 may have a mounting lug machined from thick-walled lug portion 125, and may have ramp surfaces machined on base portion 136 similar to ramp surfaces 39a-d, described above. Base portion 136 may also be cut length-wise, parallel axis $A_3$, to provide an open ended clamp component similar to component 30 described herein. In certain embodiments the mounting lugs machined from thick walled lug portion 125 may have a bore such as a threaded bore machined therein, and the portion 141 of each of the blanks from elongate body 140 may also have a bore such as a threaded bore machined therein.

Once the various features have been machined on the respective blanks, the components of a first type, derived from elongate body 130, may be paired with components of the second type, derived from elongate body 140, and assembled for shipping, use, etc. In other embodiments, rather than extrusions, each of elongate bodies 130 and 140 might comprise a cast body, a composite molded body, or any of a variety of other materials manufactured in various ways. It should be appreciated that other mounting device embodiments may be made from correspondly different elongate bodies. Moreover, the versions shown in FIGS. 5 and 6 are illustrative only, and actual extrusions, moldings, etc., from which devices contemplated herein are made may differ substantially.

It is contemplated that manufacturing of instrument mounting devices in a manner described herein will provide improvements over known strategies, particularly in that a relatively large number of subcomponents may be manufactured from a relatively small number of elongate bodies serving as the starting units. This contrasts with traditional designs wherein rivets, screws, or any of a variety of other pieces of hardware had to be separately manufactured and assembled to provide a suitable instrument mounting device. Moreover, where relatively good conductors such as aluminum are used, the relatively uniform nature of the component material, as well as its inherent conducting properties will provide a relatively low electrical resistance mounting device. Further still, the procedure for adjusting component 30 from its first configuration to its clamping configuration does not place undue stress or strain on the components. That is, the use of opposed linear ramp surfaces provides a relatively robust interface between components 30 and 40, substantially reducing the risk of failure as compared with certain earlier designs.

The present description is for illustrative purposes only and should not be construed to narrow the breadth of the present disclosure in any way. Thus, those skilled in the art will appreciate that various modifications might be made to the presently disclosed embodiments without departing from the full and fair scope of the present disclosure. Other aspect, features and advantages will be apparent upon an examination of the attached drawings and appended claims.

What is claimed is:

1. A mounting device for mounting a sensing instrument in an instrument panel comprising:

a first component that includes a flexible band having an outer diameter, an inner diameter comprising a clamping surface for clamping about a sensing instrument, and a mounting lug positioned on said outer diameter for coupling said device with an instrument panel;

said band further having a top edge, a bottom edge, a first end and a second end, and said first component further including first ramp surfaces located adjacent each of said first and second ends, respectively, and extending diagonally between the top and bottom edges of said band; and a second component configured to couple with said first component, said second component having a top edge, a bottom edge and second ramp surfaces extending diagonally between the top and bottom edges of said second component, and said second component being movable relative to said first component when coupled therewith to adjust said band from a first configuration to a second, clamping configuration via sliding engagement between said first ramp surfaces and said second ramp surfaces;

wherein said second component includes a bore receiving a fastener for adjusting a position of said second component relative to said first component when coupled therewith;

wherein said first ramp surfaces comprise linear surfaces diverging from one another in a direction toward the top edge of said first component, and wherein said second ramp surfaces also comprise linear surfaces diverging from one another in a direction toward the top edge of said second component; and wherein each of said first and second ramp surfaces comprise undercut ramp surfaces.

2. The device of claim 1 wherein said bore comprises internal threads.

3. The device of claim 1 wherein said first ramp surfaces face away from the corresponding first and second ends of said band, wherein said second component includes a longitudinal axis extending between midpoints of said top and bottom edges, and wherein said second ramp surfaces face toward said longitudinal axis.

4. The device of claim 3 wherein said first component consists of a single piece component, and wherein the inner diameter of said band defines a regular cylinder when said first component is in said second configuration.

5. The device of claim 3 wherein each of said first and second components is cut from an elongate body which comprises an extrusion.

6. The device of claim 1 wherein each of said first and second components is cut from an elongate body which comprises an extrusion.

7. A mounting device of for mounting a sensing instrument in an instrument panel comprising:

a first component that includes a flexible band having an outer diameter, an inner diameter comprising a clamping surface for clamping about a sensing instrument, and a mounting lug positioned on said outer diameter for coupling said device with an instrument panel;

said band further having a top edge, a bottom edge, a first end and a second end, and said first component further including first ramp surfaces located adjacent each of said first and second ends, respectively, and extending diagonally between the top and bottom edges of said band; and a second component configured to couple with said first component, said second component having a top edge, a bottom edge and second ramp surfaces extending diagonally between the top and bottom edges of said second component, and said second component being movable relative to said first component when coupled therewith to adjust said band from a first configuration to a second, clamping configuration via sliding engagement between said first ramp surfaces and said second ramp surfaces wherein said first ramp surfaces include two sets of parallel ramp surfaces, and wherein said second ramp surfaces also include two sets of parallel ramp surfaces.

8. A method of mounting a sensing instrument to an instrument panel comprising the steps of:

positioning a sensing instrument within an instrument panel;

positioning a flexible band of a first component about a portion of the instrument, the flexible band having an inner diameter that comprises a clamping surface for clamping about an instrument and first diagonal ramp surfaces extending between top and bottom edges of the band and positioned adjacent first and second ends of the band;

coupling the first component to the instrument panel via a mounting lug positioned on an outer diameter of the flexible band;

clamping the flexible band about the instrument at least in part by slidingly engaging second diagonal ramp surfaces of a second component with the first diagonal ramp surfaces to adjust a configuration of the flexible band to a clamping configuration;

wherein each of the first and second diagonal ramp surfaces includes an undercut shape, and the method further includes a step of interlocking the first and second components by way of the undercut shape during the clamping step.

9. The method of claim 8 wherein the clamping step comprises slidingly engaging the second diagonal ramp surfaces by rotating a threaded fastener extending in a bore in the second component.

10. The method of claim 9 wherein the step of interlocking further includes interlocking a plurality of sets of the second diagonal ramp surfaces with a plurality of sets of the first diagonal ramp surfaces, each of the plurality of sets of the first and the second diagonal ramp surfaces having different axial locations relative to a longitudinal axis of a bore formed in the second component.

11. The method of claim 9 wherein the clamping step comprises slidingly engaging two sets of two ramp surfaces of the second component with a corresponding two sets of two ramp surfaces of the first component.

12. A mounting device for mounting a sensing instrument in an instrument panel comprising:

a first component that includes a flexible band having an outer surface, an inner surface comprising a clamping surface for clamping about a sensing instrument, and a mounting lug for coupling said device with an instrument panel;

said band further having a top edge, a bottom edge, and first and second ends including first and second end portions, respectively, each having a relatively greater thickness between the inner and outer surfaces, wherein the outer surface and the inner surface each extend from the first end to the second end, and the band includes a relatively lesser thickness between the inner and outer surfaces, from the first end portion to the second end portion;

the first component further including first ramp surfaces located adjacent each of the first and second ends respectively, the first ramp surfaces including machined surfaces formed on the first and second end portions and extending diagonally between the top and bottom edges of said band; and a second component configured to couple with said first component, said second component having a top edge, a bottom edge and second ramp surfaces extending diagonally between the top and bottom edges of said second component, and said second component being movable relative to said first component when coupled therewith to adjust said band from a first configuration to a second, clamping configuration via sliding engagement between said first ramp surfaces and said second ramp surfaces.

* * * * *